United States Patent
Bertin et al.

(10) Patent No.: US 6,433,618 B1
(45) Date of Patent: Aug. 13, 2002

(54) VARIABLE POWER DEVICE WITH SELECTIVE THRESHOLD CONTROL

(75) Inventors: Claude Louis Bertin, South Burlington; Alvar Antonio Dean; William Robert Patrick Tonti, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/146,834

(22) Filed: Sep. 3, 1998

(51) Int. Cl.⁷ .................................................. G05F 1/10
(52) U.S. Cl. ........................ 327/534; 327/108; 326/87
(58) Field of Search ............................ 327/108, 109, 327/112, 534, 170, 411, 409, 410, 413, 403, 404, 412; 326/34, 36, 85, 87, 91

(56) References Cited

U.S. PATENT DOCUMENTS

| | | | |
|---|---|---|---|
| 3,829,882 A | 8/1974 | Arai | 357/23 |
| 4,157,557 A | 6/1979 | Sato et al. | 357/23 |
| 4,234,807 A | 11/1980 | Esser et al. | 307/304 |
| 5,194,765 A | * 3/1993 | Dunlop et al. | 327/112 |
| 5,557,231 A | 9/1996 | Yamaguchi et al. | 327/534 |
| 5,672,995 A | 9/1997 | Hirase et al. | 327/534 |
| 5,682,118 A | 10/1997 | Kaenel et al. | 327/534 |
| 5,703,496 A | * 12/1997 | Sabin | 326/27 |
| 5,751,173 A | * 5/1998 | McMahon et al. | 327/112 |
| 5,821,783 A | * 10/1998 | Torimaru et al. | 327/108 |
| 5,877,647 A | * 3/1999 | Vajapey et al. | 327/112 |

* cited by examiner

Primary Examiner—Jung Ho Kim
(74) Attorney, Agent, or Firm—Schmeiser, Olsen & Watts; Mark F. Chadurjian

(57) ABSTRACT

A variable power device circuit includes a plurality of devices for driving a load. Each of the devices has a body, which is electrically isolated from the substrate. All of the devices are coupled to an output node. The load is also coupled to the output node. A controller selectively turns on individual or multiple ones of the devices based on the electrical requirements of the load.

17 Claims, 7 Drawing Sheets

VARIABLE POWER DEVICE WITH SELECTIVE THRESHOLD CONTROL

BACKGROUND OF THE INVENTION

1. Technical Field

The invention relates generally to semiconductor devices, and more specifically, to variable power control for semiconductor devices.

2. Background Art

For battery applications for Application Specific Integrated Circuit (ASIC) devices, or similar semiconductor devices, low power usage is important. Semiconductor devices comprising transistors for driving a load for such devices should operate at their maximum speed. When the device is in stand-by mode, the transistors should be off. Also, depending on how much voltage is needed to drive a load, the device's transistors should be able to provide that voltage without leaking too much current.

Examples of controlling the voltage through various transistors are found in the following U.S. Patents, which are hereby incorporated by reference: U.S. Pat. No. 5,682,118, "Circuit for Controlling the Voltages Between Well and Sources of the Transistors of and MOS Logic Circuit, and System for Slaving the Power Supply to the Latter Including the Application Thereof," issued October 1997 to Kaenel et al.; U.S. Pat. No. 5,557,231, "Semiconductor Device with Improved Substrate Bias Voltage Generating Circuit," issued September 1996 to Yamaguchi et al.; and U.S. Pat. No. 4,157,557, "Control Circuit for Signal Transmission," issued June 1979 to Sato et al. Although each of the aforementioned patents disclose the control of voltage through transistors, they do not disclose how the transistor leakage current may be varied and controlled through geometric transistor properties (e.g., width, length, etc.).

SUMMARY OF THE INVENTION

It is thus an advantage of the present invention to provide a variable power device that eliminates the above-described and other limitations.

The advantages of the invention are realized by a variable power device circuit. The variable power device circuit comprises a plurality of devices for driving a load. Each of the devices has a body, which is electrically isolated from the substrate. All of the devices are coupled to an output node. The load is also coupled to the output node. A controller selectively turns on individual or multiple ones of the devices based on the electrical requirements of the load.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
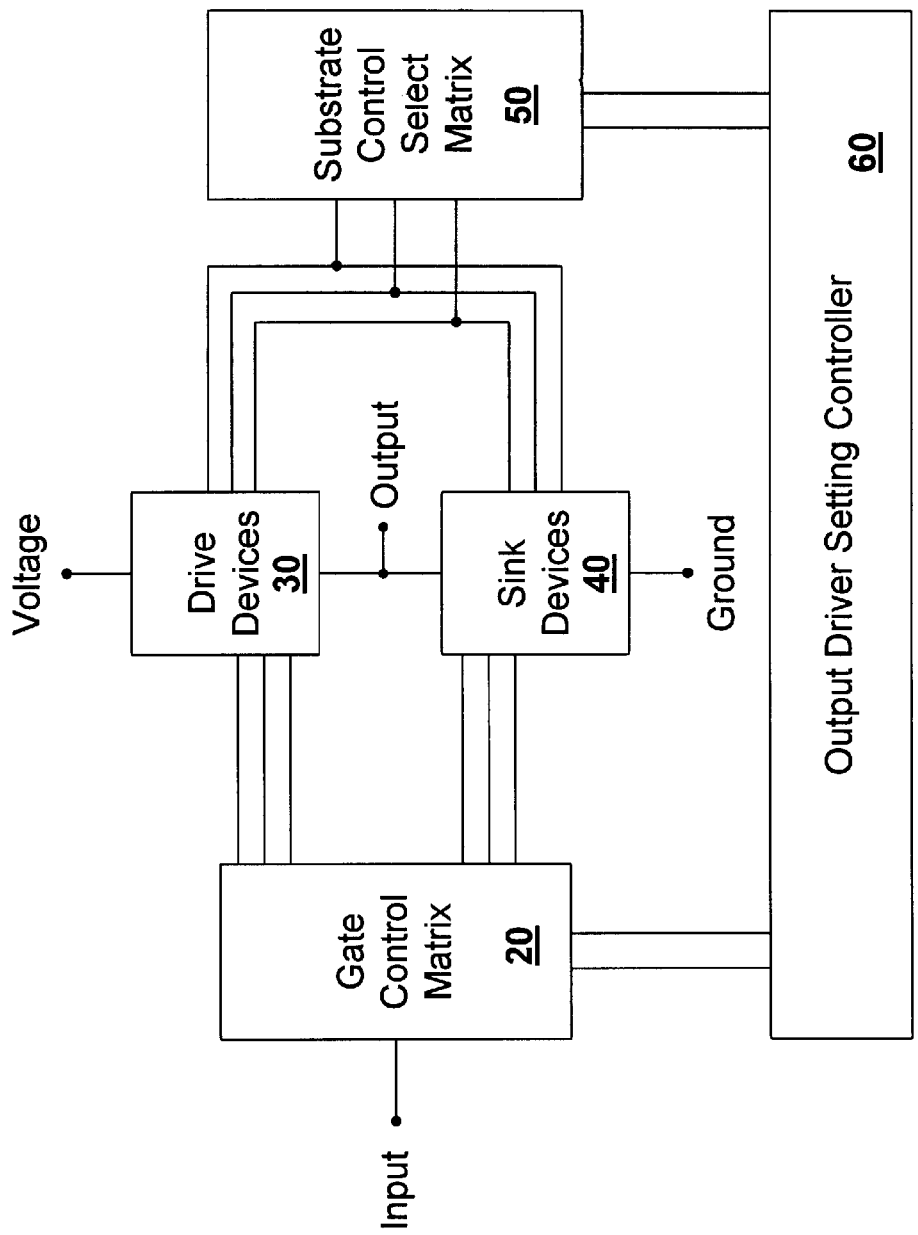
FIG. 1 is a block diagram illustrating a variable power device in accordance with a preferred embodiment of the present invention.

Referring to FIG. 1, a variable power device circuit 10 in accordance with a preferred embodiment of the present invention is shown. Variable power device circuit 10 comprises gate control matrix 20, drive devices 30, sink devices 40, substrate control select matrix 50 and output driver setting controller (ODSC) 60. ODSC 60 controls both gate control matrix 20 and substrate control select matrix 50. Gate control matrix 20 and substrate control select matrix 50 control the amount of drive current handling capability of variable power device circuit 10 through activating/deactivating drive devices 30 and sink devices 40 electronically, as will be discussed in greater detail below.

Figure 2:
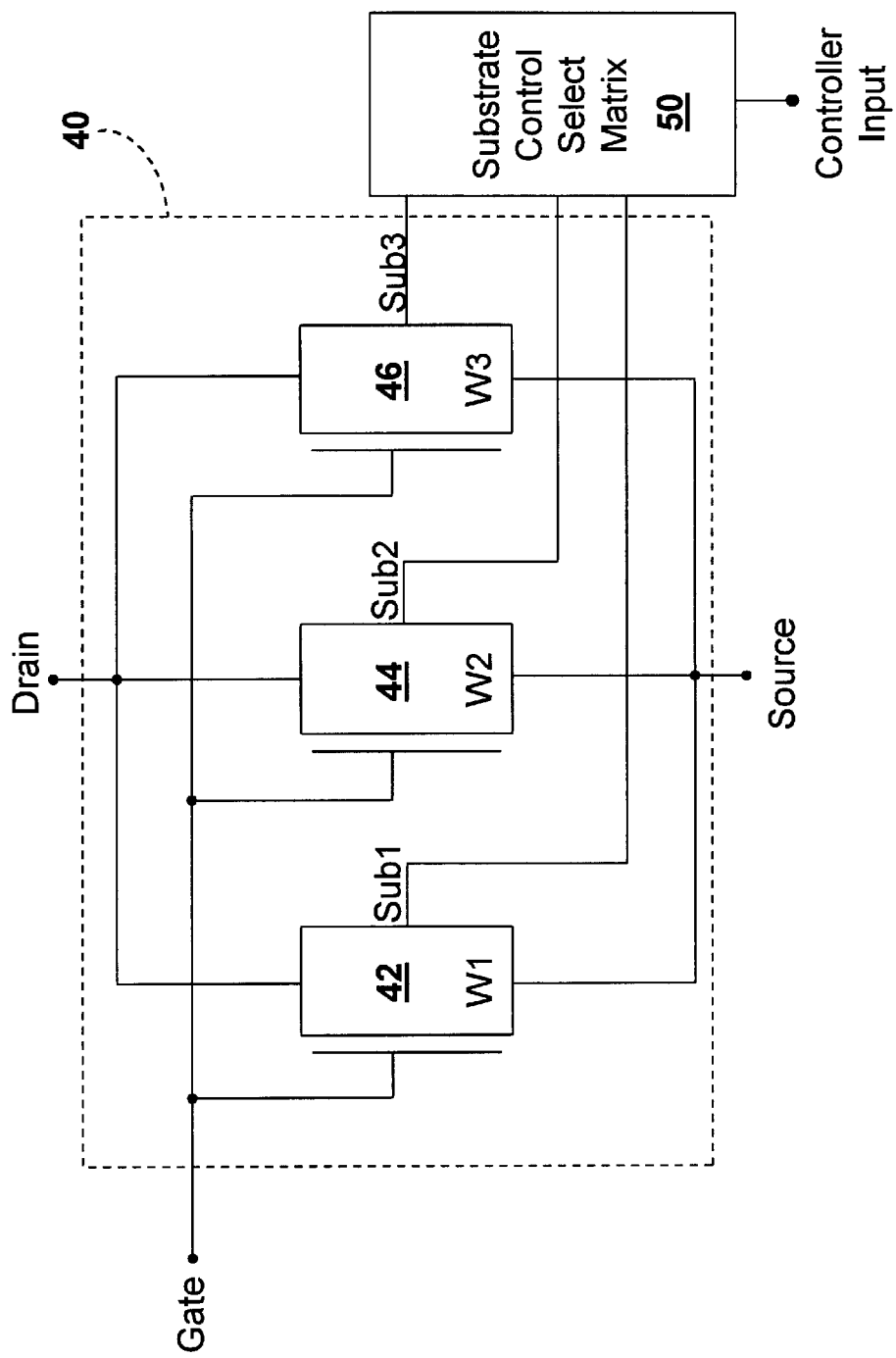
FIG. 2 is a circuit diagram of the exemplary sink devices of FIG. 1.
Figure 10:
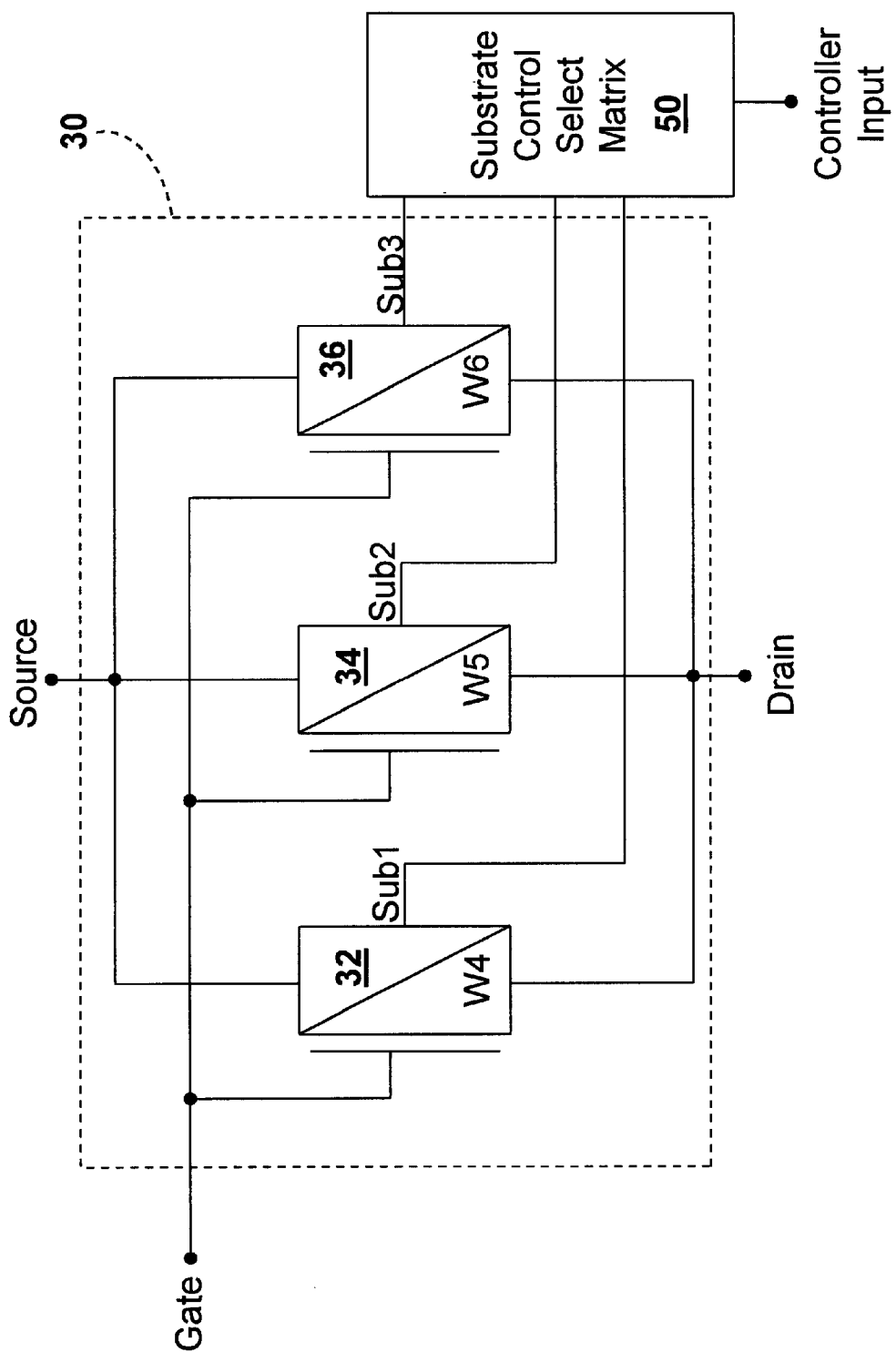
FIG. 10 is a circuit diagram of exemplary drive devices for FIG. 1.

The drive devices 30 of the present invention, which are typically multiple PMOS devices (as shown in FIG. 10), drive loads off-chip from the voltage source. The sink devices 40 of the present invention, which are typically multiple NMOS devices (as seen in FIG. 2), sink current arriving from off-chip. The bias point of the drive 30 and sink 40 devices are controlled by the substrate control select matrix 50. The bias point may also be controlled by gate control matrix 20. One advantage of the variable power device circuit 10 of the present invention is that when the full drive capability is not required for the output, the unneeded portions of the drive devices 30 and sink devices 40 are turned off in a manner that delivers much smaller leakage currents, thus, consuming minimal standby power. Furthermore, active power may be optimally controlled, wherein substrate control select matrix 50 controls the bias points, which adjust the threshold voltage to selected portions of drive devices 30 and sink devices 40 to achieve the desired performance and power configuration.

FIG. 2 illustrates an exemplary circuit for sink devices 40 of FIG. 1. In this example, sink devices 40 comprise three NMOS devices 42, 44 and 46. Although three devices are shown, any number of devices (from 2 to n) may also be used. The gates of devices 42, 44 and 46 are all tied in parallel and represent a simple form of gate control matrix 20 (FIG. 1). The sources of NMOS devices 42, 44 and 46 are also tied in parallel, as are the drains of devices 42, 44, and 46. The common drain is then normally used for the output of variable power device circuit 10 (FIG. 1). The substrate bias may be individually controlled by lines Sub1, Sub2, and Sub3 from substrate control select matrix 50. The selection of Sub1, Sub2 and Sub3 determines the performance level of the variable power device circuit 10.

The three NMOS devices 42, 44 and 46 are shown with channel widths W1, W2 and W3. The widths may be different, or they may be the same. The lengths also may be different or they may be the same. Short channel length devices are used to acquire more output drive from the driver for a given gate width and drive. The substrate control select matrix 50 adjusts substrate bias to reduce leakage current for short channel length devices. The substrate bias varies the threshold voltage (Vt) of the devices. A high Vt turns off the device altogether, including minimizing the sub-threshold leakage currents. A low Vt turns the portion of the device in that substrate on. As aforementioned, the substrate control select matrix 50 may also adjust the subthreshold leakage of each device independently. Thus, a device may be set near conduction ("on") with higher leakage for a faster drive, or it may be set away from conduction for very low leakage and low drive. Once devices are in the "on" state, the substrate modulation will vary the "on" current by a relatively small amount (approximately a 10 to 20% variation). If a large variation is desired, it is necessary to control the gates as well, as will be discussed in reference to FIGS. 8 and 9.

Figure 3:
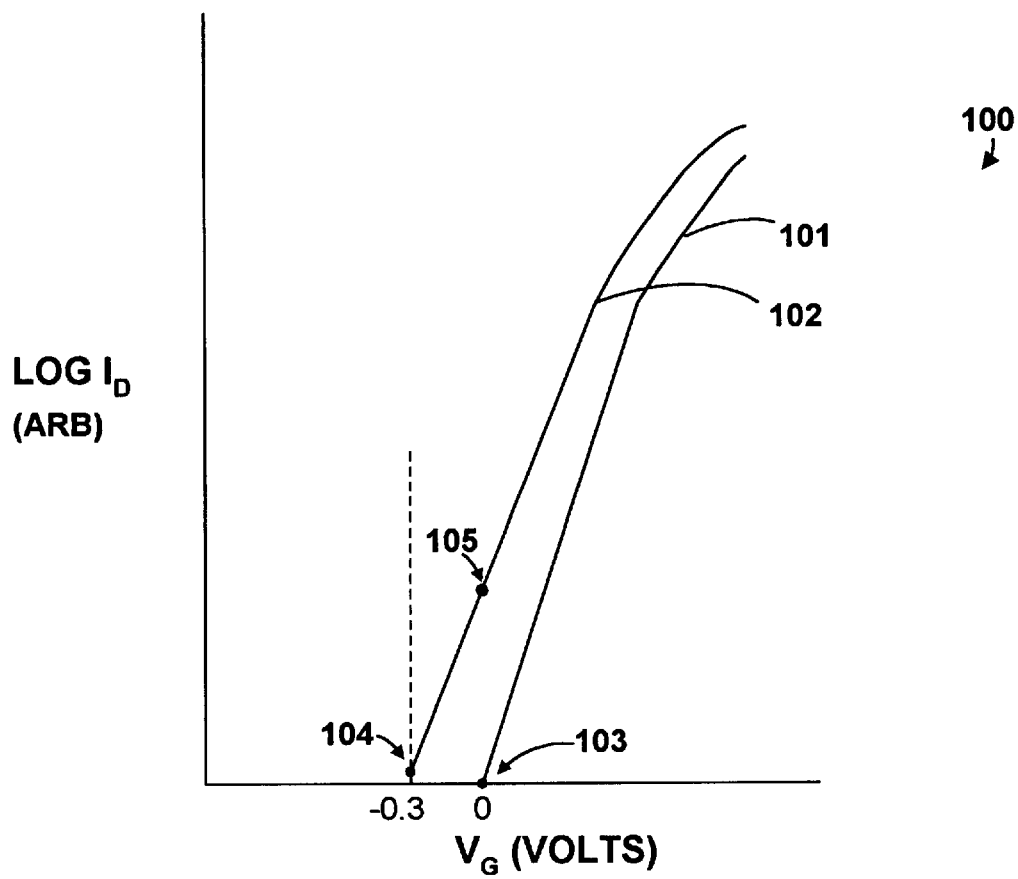
FIG. 3 is a graph of the threshold voltage vs. drain current for the NMOS devices of FIG. 2.

FIG. 3 shows the gate voltage vs. the drain current $I_D$ (log scale) for an NMOS device, such as one shown in FIG. 2. As seen in FIG. 3, curve 101 is for a relatively long channel length device. Curve 102 illustrates a relatively short channel length device. For this specific example, when curve 102 has a gate voltage of −0.3 volts the leakage current at point 104 is approximately the same as the leakage current at point 103 on curve 101. However, when the gate voltage is zero for curve 102, the leakage current is approximately one hundred times larger. The gate voltage may be reduced by biasing the gate below ground, or by making the substrate more negative relative to the source of the NMOS device, thus increasing the device threshold voltage and reducing the device leakage. In the present invention, both of these methods may be used to reduce leakage current.

Figure 4:
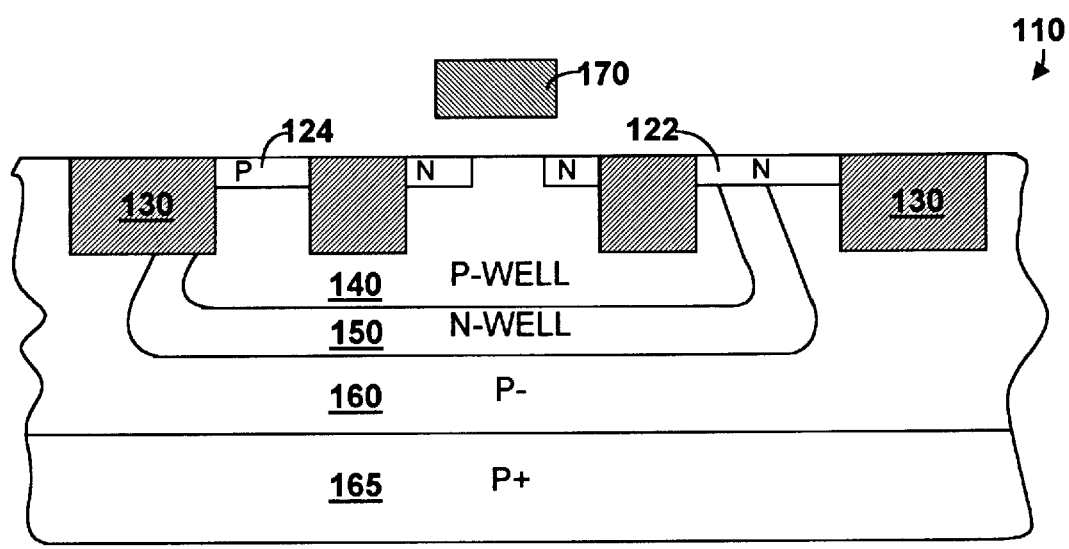
FIG. 4 is a cross-sectional view of a self-aligned isolated well, which may be used for the NMOS devices of FIG. 2.
Figure 7:
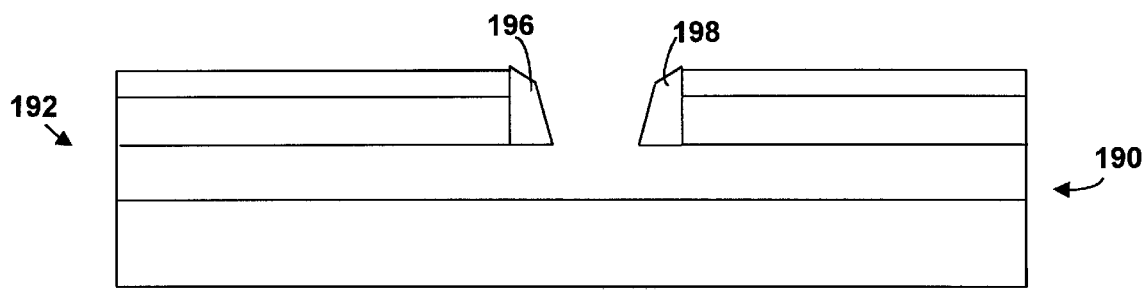

FIGS. 4 and 7 illustrate exemplary structures used in the present invention for isolating devices from the common substrate in a bulk process (FIG. 4) and in a Silicon-On-Insulator (SOI) environment (FIG. 7). In both structures the substrate bias, and thus the threshold voltage can be individually controlled for each device. FIG. 4 illustrates a halo-isolated p-well in a p-substrate, although an n-well in an n-substrate may also be used. The structure 110 comprises a p-well contact 124, an n-well contact 122, a gate electrode 170, isolation 130, p-well 140, n-well 150, and substrate p− 160 and p+ 165. This type of structure 110 is discussed in greater detail in IBM Dkt. No. BU9-97-032, "Method of Forming Self-Aligned Halo-Isolated Wells" by Kalter et al., which is herein incorporated by reference.

Figure 5:
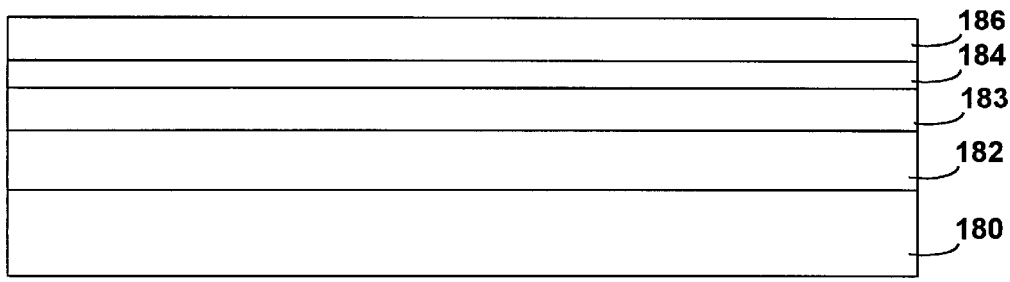
FIGS. 5, 6 and 7 are cross-sectional views of a fabrication sequence for other exemplary isolated devices, which may be used for the NMOS devices of FIG. 2.
Figure 6:
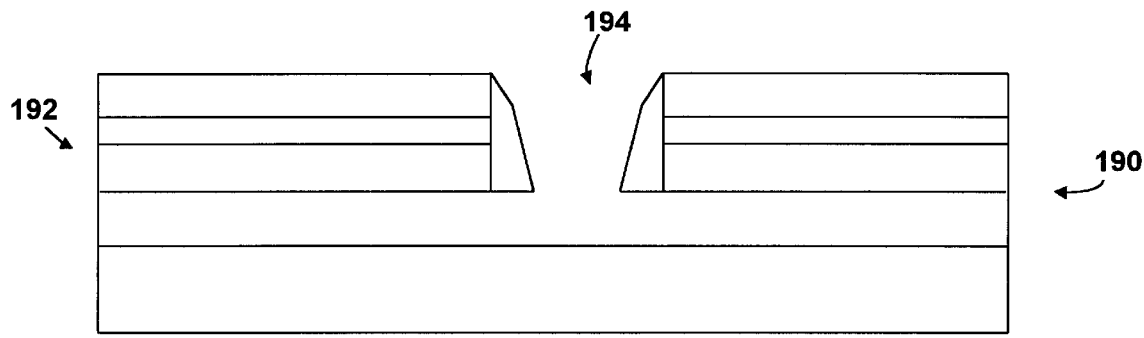

FIGS. 5, 6, and 7 show a fabrication sequence in SOI, wherein at least two regions are separated, which may be contacted independently. FIG. 5 shows a starting wafer comprising silicon substrate layer 180, back oxide layer 182, silicon layer 183, deposited nitride layer 184, and deposited oxide layer 186. Although these specific layers are shown, other appropriate layers may be used for a starting wafer. In FIG. 6, the formation of a conducting spacer 194 creates SOI substrate 192 and SOI substrate 190. FIG. 7 shows the separate contacts 196 and 198 to substrate regions 192 and 190, respectively.

Figure 8:
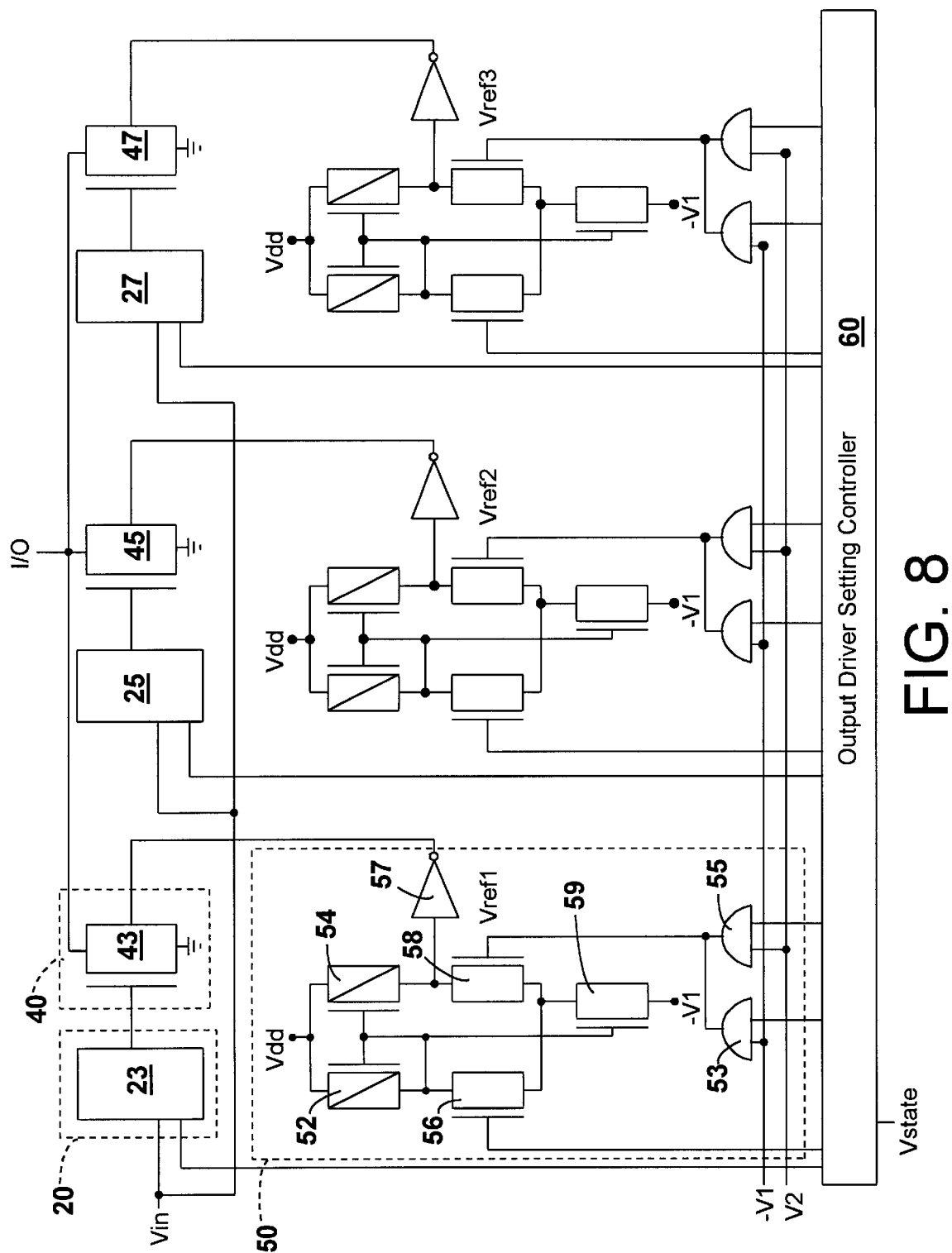
FIGS. 8 and 9 are exemplary circuit diagrams of a variable power device of FIG. 1 without the drive devices of FIG. 1.

FIG. 8 illustrates a variable device circuit having output driver setting controller 60, three sink devices 40 (devices 43, 45 and 47), gate control matrix elements 20 (pre-amplifier devices 23, 25 and 27), and three substrate control select matrix elements 50. Although only the sink devices 40 are shown in this and other examples, it is to be understood that the drive devices 30 (as seen in FIGS. 1 and 10) may also be applied to these examples, alone, or in combination with sink devices 40, wherein PMOS transistors and their corresponding electrical connections may be used.

Each substrate control select matrix element 50 comprise PFETs 52, 54, NFETs 56, 58 and 59, amplifier 57, and AND gates 53 and 55. PFETs 52, 54 and NFETs 56, 58 and 59 are configured as a comparator, wherein the sources of PFETs 52 and 54 are tied to Vdd; the gates of PFETs 52 and 54 are coupled together, to the drain of PFET 52 and to the gate of NFET 59; the drains of PFETs 52 and 54 are coupled to the drains of NFETs 56 and 58, respectively; the sources of NFETs 56 and 58 are coupled to the drain of NFET 59; the gate of NFET 56 is coupled to output driver setting controller 60; the gate of NFET 58 is coupled to the outputs of AND gates 53 and 55 (Vref1); and the source of NFET 59 is tied to −V1. The drain of PFET 54 is coupled to amplifier 57, which controls the bias point of device 43. AND gate 53 is coupled to voltage source −V1 and to output driver setting controller 60. AND gate 55 is coupled to voltage source V2 and to output driver setting controller 60.

The gate of device 43 is coupled to pre-amplifier 23 in the first stage, the gate of device 45 is coupled to pre-amplifier 25 in the second stage, and the gate of device 47 is coupled to pre-amplifier 27 in the third stage. The drains of devices 43, 45 and 47 are tied to the output (I/O) and the sources of devices 43, 45 and 47 are tied to ground. The inputs to pre-amplifiers 23, 25 and 27 are coupled to Vin and control signals from output driver setting controller 60. Output driver setting controller 60 may be programmed through at least one input (Vstate).

In operation, the gate voltage (Vin) drives all pre-amplifier stages in parallel. However, the second input to the pre-amplifiers 23, 25 and 27 from the output driver setting controller 60 determines which device 43, 45 or 47 will be powered. The back bias control of the substrates of devices 43, 45 and 47 is used to adjust the variable device circuit for high current of low power mode when selected. It is not required to turn off the devices 43, 45 or 47 using the substrate control, because this may be done at the pre-amplifier stage. The output (I/O), which can be high performance, low power, etc., set by the output driver setting controller is determined by inputs Vstate (e.g., Vstate1, Vstate2, etc.). The output driver setting controller can activate any one of the output devices (device 43, 45 or 47), any pair of devices, all three devices, or no devices. It is also possible to use only two devices. If there is deterioration on device characteristic over the usage life, then device 47 (unused) may be substituted for device 43 or 45.

Within substrate control select matrix 50, Vref1 controls device 43, Vref2 controls device 45 and Vref3 controls device 47. The references (Vref) are set by selecting −V1 or V2 for each I/O device. The output driver setting controller 60 selects −V1 or V2 by selecting the appropriate line into AND gates 53 and 55. If −V1 is selected, the negative voltage on the substrate increases the device (e.g., device 43) threshold voltage and device 43 will have low leakage but relatively low output current. If V2 is selected, the threshold voltage is lower, enabling high power output. In this manner, the output driver setting controller enables a wide variety of current handling capability for each device 43, 45 and 47.

Figure 9:
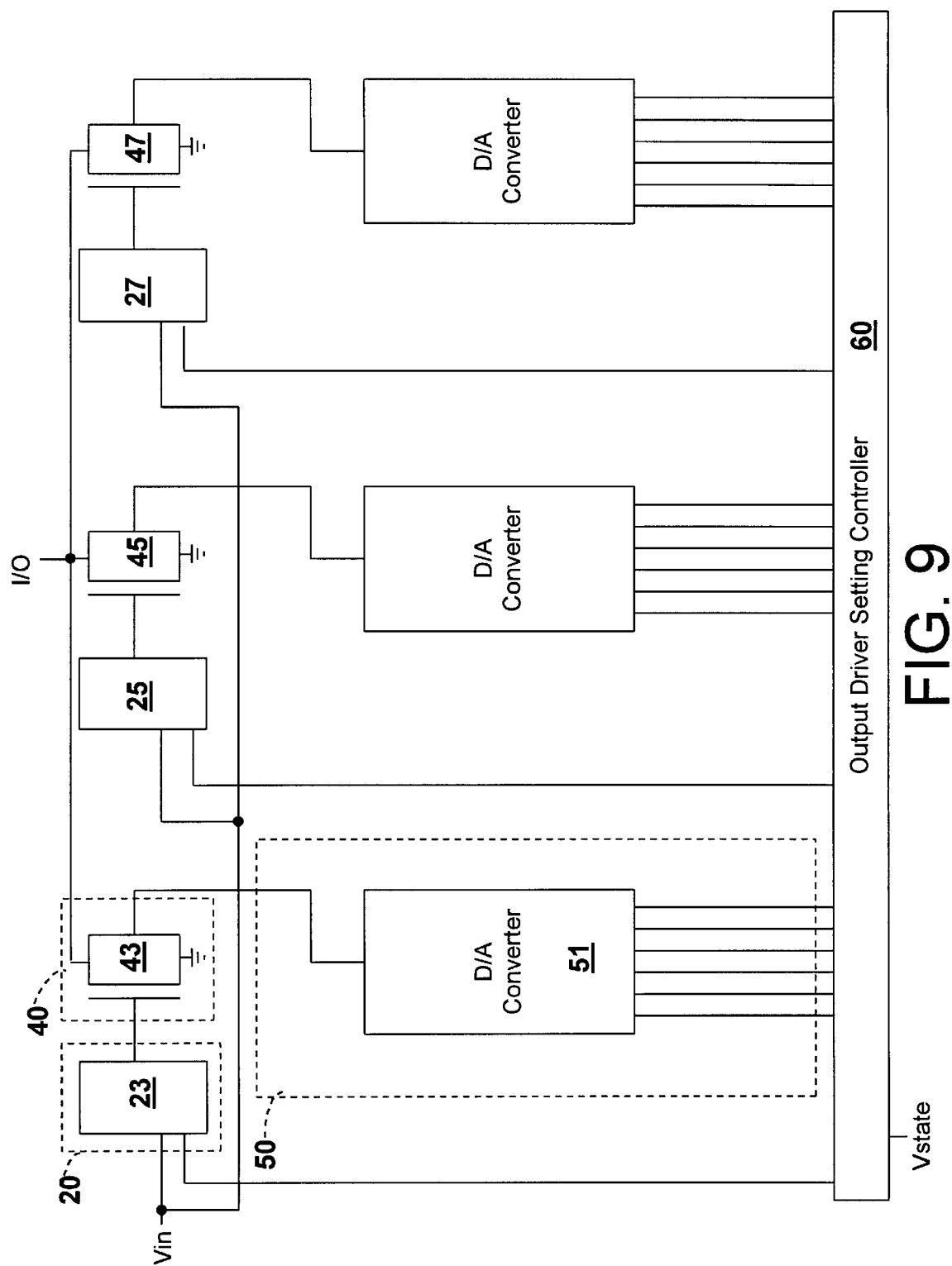

FIG. 9 is similar to FIG. 8 except substrate control select matrix 50 comprises a digital-to-analog (D/A) converter 51 instead of the comparator/amplifier of FIG. 8. D/A converter 51 of FIG. 9 allows "n" amount of voltages to be used for controlling the bias control of the substrates for devices 43, 45 and 47 instead of just 2 voltages (−V1 and V2), hence, maximizing the performance of the variable power device of the present invention.

FIG. 10 illustrates an exemplary circuit for drive devices 30 of FIG. 1. In this example, drive devices 30 comprise three PMOS devices 32, 34 and 36. Although three devices are shown, any number of devices (from 2 to n) may also be used. The gates of devices 32, 34 and 36 are all tied in parallel and may be controlled through gate control matrix 20 (FIG. 1). The sources of PMOS devices 32, 34 and 36 are also tied in parallel, as are the drains of devices 32, 34, and 36. The common drain is then normally used for the output of variable power device circuit 10 (FIG. 1). The substrate bias may be individually controlled by lines Sub1, Sub2, and Sub3 from substrate control select matrix 50. The selection of Sub1, Sub2 and Sub3 determines the performance level of the variable power device circuit 10. The three PMOS devices 32,34 and 36 are shown with channel widths W4, W5 and W6, which may be different, or the same. As aforementioned, the above examples that show only sink devices 40, may also use drive devices 30, such as the ones disclosed in FIG. 10, with the appropriate connections for PMOS devices as opposed to NMOS devices. Drive devices 30 may be used in conjunction with sink devices 40, or by themselves. Drive devices 30 may also be controlled by the means described in FIGS. 8 and 9.

Thus, the variable power device according to the present invention allows for maximized performance, or minimized FET leakage current when maximum performance is not required, by completely shutting off unneeded portions of the device width.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An integrated circuit formed in a substrate, the circuit comprising:
    a plurality of devices for driving a load, each of the devices having a body electrically isolated from the substrate, each of the devices having a substrate region and an adjustable threshold voltage, and each of the devices being coupled to an output node, said load coupled to the output node; and
    a circuit for selectively turning on individual or multiple ones of the devices at a predetermined adjustable threshold voltage based on electrical requirements of the load.

2. The circuit of claim 1, further comprising:
    a circuit for individually adjusting the threshold voltage of each of the devices for reducing leakage currents through ones of the devices that have not been turned on.

3. The circuit of claim 1, further comprising a circuit for individually adjusting the threshold voltage of each of the devices for increasing a drive current through ones of the devices that have been turned on.

4. The circuit of claim 1, wherein said circuit for selectively turning on comprises:
    a substrate control select matrix coupled to the substrate region of each of the devices for adjusting the threshold voltage of each of the devices through the corresponding substrate region.

5. The circuit of claim 1, wherein said circuit for selectively turning on comprises:
    a gate control matrix coupled to a gate of each of the devices.

6. The circuit of claim 4, wherein said substrate control select matrix comprises:
    a digital-to-analog converter.

7. The circuit of claim 5, wherein said gate control matrix comprises:
    a pre-amplifier circuit.

8. A method for varying the output of a power device comprising the steps of:
    a) providing a plurality of devices, each of the devices having a body and an adjustable threshold voltage;
    b) electrically isolating each body from a substrate of said plurality of devices to provide each of the devices with a substrate region;
    c) coupling said plurality of devices to an output node;
    d) coupling a load to said output node;
    e) driving said load with said plurality of devices; and
    f) selectively turning on individual or multiple ones of the devices at a predetermined adjustable threshold voltage based on electrical requirements of the load.

9. The method of claim 8, further comprising the steps of:
    g) individually adjusting the threshold voltage of each of the devices for reducing leakage currents through ones of the devices that have not been turned on.

10. The method of claim 8, further comprising the steps of:
    g) individually adjusting the threshold voltage of each of the devices for increasing a drive current through ones of the devices that have been turned on.

11. The method of claim 8, wherein step f) further comprises the step of:
    f1) adjusting the threshold voltage through the substrate region of each of the devices.

12. The method of claim 8, wherein step f) further comprises the step of:
    f1) controlling each of the devices through each gate of the devices.

13. A system comprising:
    a load;
    an integrated circuit formed in a substrate, the circuit having:
        a plurality of devices for driving the load, each of the devices having a body electrically isolated from the substrate, each of the devices having a substrate region and an adjustable threshold voltage, and each of the devices coupled to an output node, said load coupled to the output node; and a controller for selectively turning on individual or multiple ones of the devices and for adjusting each of said threshold voltages based on electrical requirements of the load.

14. The system of claim 13, further comprising:

a circuit for individually adjusting the threshold voltage of each of the devices for reducing leakage currents through ones of the devices that have not been turned on.

15. The system of claim 13, further comprising:

a circuit for individually adjusting the threshold voltage of each of the devices for increasing a drive current through ones of the devices that have been turned on.

16. The system of claim 13, wherein said controller comprises:

a substrate control select matrix coupled to the substrate region of each of the devices for adjusting the threshold voltage of each of the devices through the corresponding substrate region.

17. The system of claim 16, wherein said controller further comprises:

a gate control matrix coupled to a gate of each of the devices; and a gate/substrate controller for controlling both said gate control matrix and said substrate control select matrix.

* * * * *